United States Patent [19]

Nagata

[11] Patent Number: 5,038,995

[45] Date of Patent: Aug. 13, 1991

[54] SOLDERING METHOD AND SOLDERING APPARATUS

[76] Inventor: Eishu Nagata, 453-23, Wakabadai, Nagareyama-shi, Chiba-ken 270-01, Japan

[21] Appl. No.: 463,065

[22] Filed: Jan. 10, 1990

[30] Foreign Application Priority Data

Jan. 10, 1989 [JP] Japan .................................. 1-2041

[51] Int. Cl.[5] .............................................. B23K 3/06
[52] U.S. Cl. ......................................... 228/033; 228/8
[58] Field of Search ..................... 228/33, 41, 52, 53, 228/8; 219/85.19; 164/136

[56] References Cited

U.S. PATENT DOCUMENTS

| 2,415,542 | 2/1947 | Vawryk | 228/53 |
| 3,015,137 | 1/1962 | Hoebing | 164/136 |
| 4,595,816 | 6/1986 | Hall et al. | 219/121 |

FOREIGN PATENT DOCUMENTS

| 34209 | 10/1971 | Japan . |
| 77427 | 7/1975 | Japan . |
| 270272 | 11/1987 | Japan . |

Primary Examiner—Kenneth J. Ramsey
Attorney, Agent, or Firm—Sughrue, Mion, Zinn Macpeak & Seas

[57] ABSTRACT

A method of applying molten solder onto a desired point of a small workpiece, such as a printed circuit board, under well-controlled condition. A solter tip is temporarily held above a solder melting pot and then allowed to fall into a solder melting pot in which the solder tip is melted and held for a pre-set time duration. In this manner, the scattering in velosity of the falling solder and the dislocation of the fallen tip are minimized to control the temperature of the molten solder precisely. A soldering apparatus used for the practice of the method of this invention is also provided. In a preferred embodiment, the soldering apparatus is provided with means for removing the debris sticking to the inner face of the solder melting pot.

13 Claims, 14 Drawing Sheets

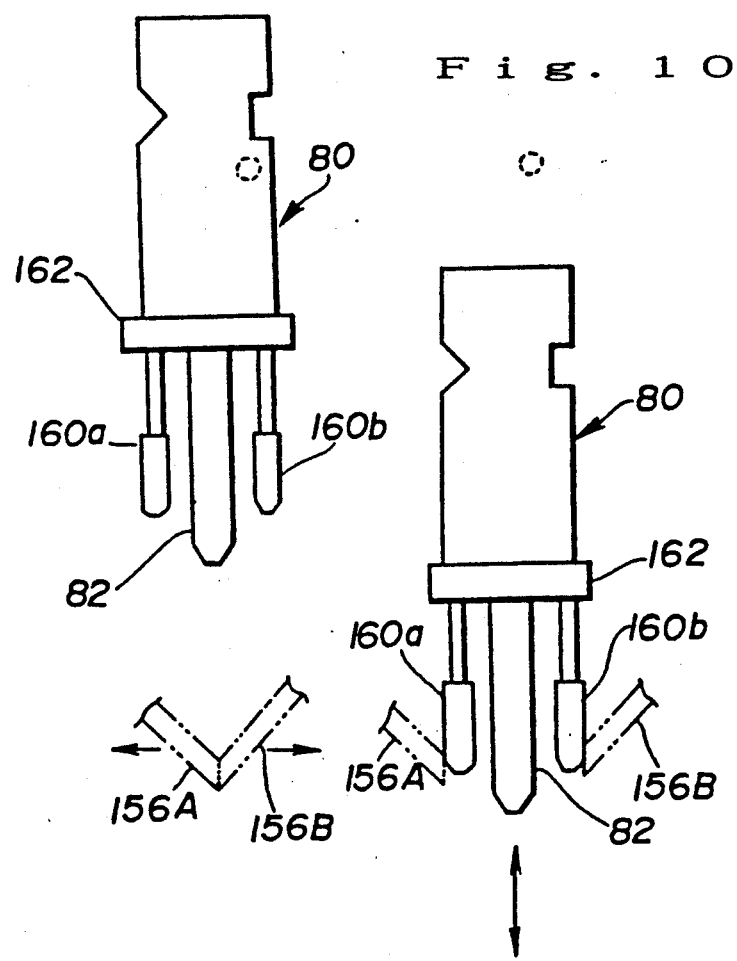

SOLDERING METHOD AND SOLDERING APPARATUS

BACKGROUND OF THE INVENTION

1. Field of the Invention

The present invention relates generally to an improvement in soldering, and more particularly to a method of and apparatus for applying molten solder onto a desired point of a workpiece under well-controlled condition.

2. Prior Art Statement

Japanese patent publication No. 34209/1971 discloses a soldering apparatus for applying molten solder onto a desired point or area of a workpiece, such as a printed circuit board, wherein a conical pot is used for melting a solid solder. A rod-shaped solder is cut and fed to the conical pot to be melted therein and the molten solder is allowed to drop through a hole provided at the bottom of the pot. However, this type soldering apparatus has a problem that some portion of the solid solder drops through the hole in the unmelted state while the other portion of the solder is dropped in the overheated condition, since it is impossible to retain the whole solid solder for a constant time, resulting in uneven and unreliable soldering.

Unexamined Japanese Utility Model Publication No. 77427/1975 discloses a soldering apparatus having a conical melting pot provided with a needle valve at the bottom of the pot. In this known apparatus, a molten mass of solder is contained in the conical melting pot, and a constant volume of the molten solder is allowed to drop through the needle valve. However, due to surface tention of the molten solder, it becomes impossible to control the volume of dropping molten solder precisely particularly when the volume of molten solder to be applied onto the workpiece is relatively small as is the case where the workpiece is a printed circuit board.

In order to solve the aforementioned problems of the known apparatuses, the inventor of this invention has previously proposed an improvement in soldering in my co-pending Japanese Patent Application No. 110505/1986. According to my previous proposal, a solder melting pot is formed by plural trowel members which engage with each other to hold a solid solder tip for a pre-set time to melt the same and then they are separated to allow the molten solder to drop onto a desired point or area of a workpiece. However, the velocity of the solid solder tip supplied to the solder melting pot cannot be controlled so that it becomes hard to control the temperature of the molten solder in the solder melting pot precisely.

Another probelm of the system according to my previous proposal is the residing flux or other impurities sticking on the end portions, particularly on the engaging end faces, of the trowel members, which lower the heat transfer from the trowel members to the solder significantly to cause change in temperature of the molten solder. Such a change in molten solder contained in the solder melting pot leads to incomplete or unstable soldering.

OBJECTS AND SUMMARY OF THE INVENTION

Accordingly, a first object of this invention is to provide an improved method of soldering a workpiece, whereby a constant volume of molten solder heated to a precisely controlled temperature is allowed to drop onto a workpiece to ensure uniform and reliable soldering even when the volume of the dropping molten solder is very small.

A second object of this invention is to provide a soldering apparatus which is used for the realization of such a reliable soldering operation.

A further object of this invention is to provide a soldering apparatus wherein the residing solder or flux sticking to the trowel members is removed by a simple operation to ensure stable and satisfactory soldering.

With aforementioned objects in view, the present invention provides an improvement in the soldering method for soldering a workpiece, which comprises forming a solder melting pot by engaging plural trowel members, each of said trowel members having a surface made of a solder repellent material at least the portion contacting with the solder, supplying a solder tip having a constant volume to said solder melting pot, melting said solder tip and holding the molten solder temporarily in said solder melting assembly, and then separating said plural trowel members to allow the molten solder to drop onto said workpiece, the improvement being characterized in that said solder tip is once held stationarily above said solder melting pot and then allowed to fall into said solder melting pot.

The present invention further provides a soldering apparatus for soldering a workpiece, comprising:

plural trowel members each having a surface made of a solder repellent material at least the portion contacting with the solder, said plural trowel members being engaged together to form a solder melting pot and separated to allow the molten solder to drop onto said workpiece;

a solder tip supply assembly for supplying a solder tip having a constant volume to said solder melting pot;

a cradle disposed above said solder melting pot for receiving said solder tip supplied from said solder tip supply assembly to hold said solder tip temporarily in the stationary condition; and inversion means for inverting said cradle to allow said solder tip to fall into said solder melting pot.

In a preferred embodiment, the soldering apparatus further comprises solder tip guide means for guiding said solder tip from said cradle to said solder melting pot, and filing means mounted to said solder tip guide means at a position above said solder melting pot to be slidingly engaged with the joining end face of each trowel member as said solder tip guide means moves in the vertical direction to clean said joining end face of each trowel.

BRIEF DESCRIPTION OF THE DRAWINGS

The above and other objects and advantages of this invention become apparent from the following description of a presently preferred embodiment illustrated, by way of example only, in the appended drawings in which:

FIGS. 10A and 10B are views illustrating the operation for filing the trowel members.

EMBODIMENT OF THE INVENTION

A presently preferred embodiment of the present invention will now be described in detail with reference to the appended drawings.

Figure 1:
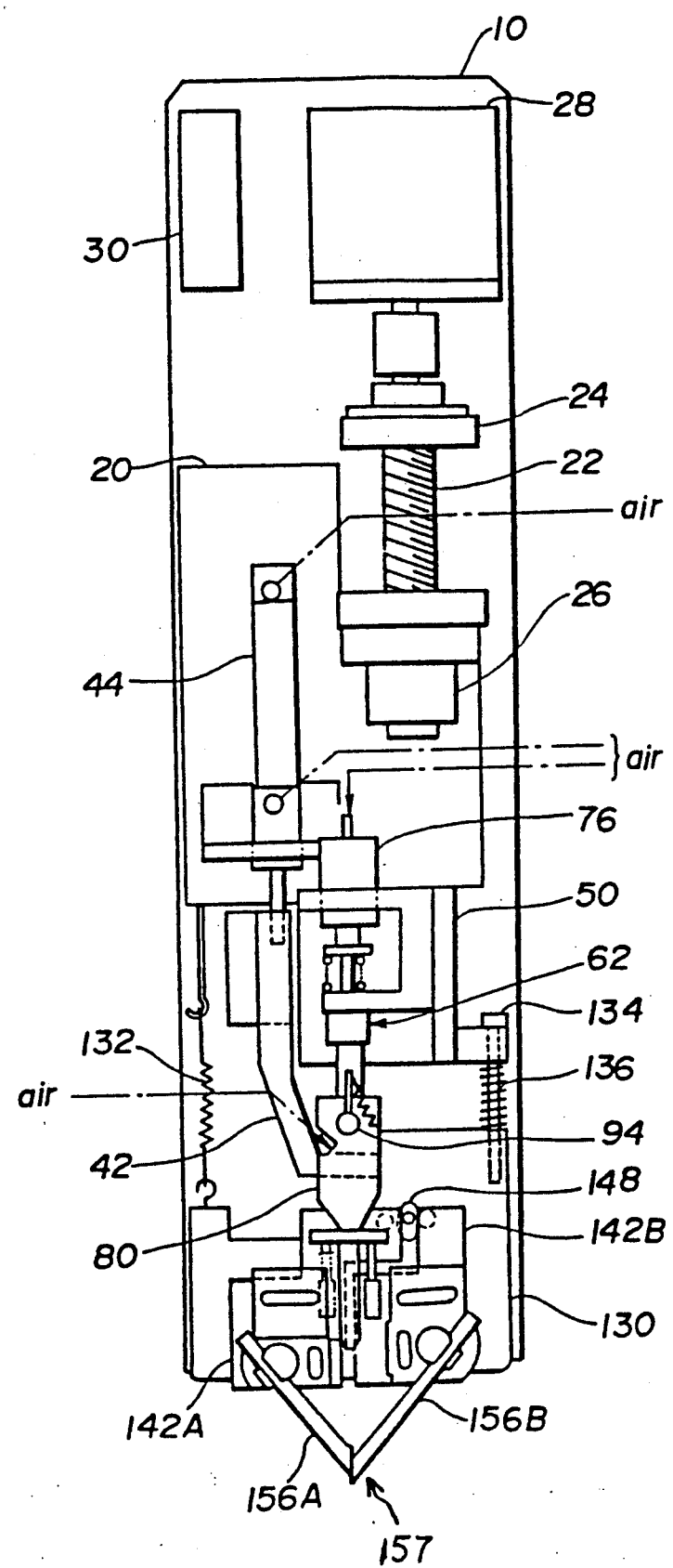
FIG. 1 is a front end view of an embodiment of the apparatus according to this invention.
Figure 2:
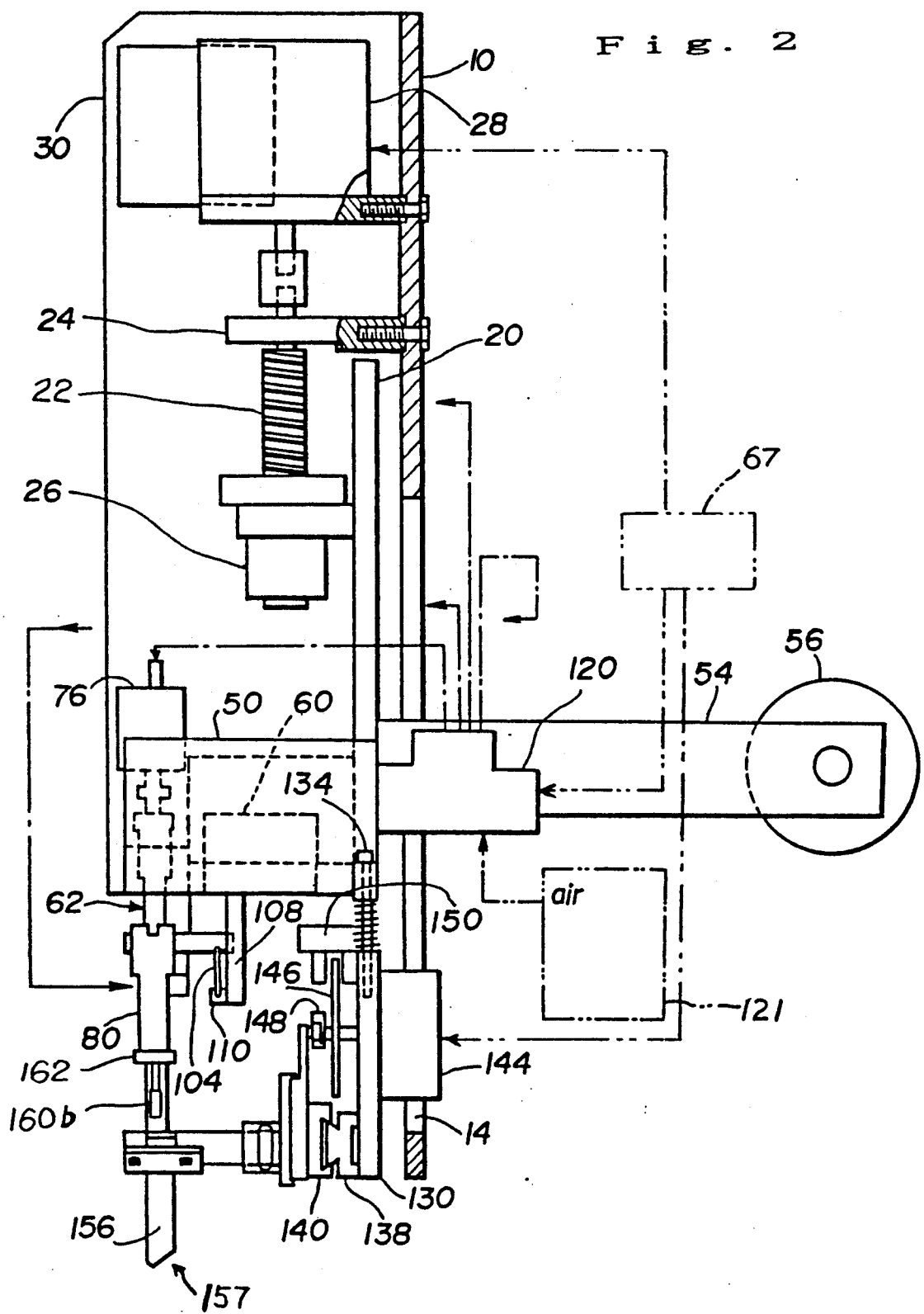
FIG. 2 shows a side elevation of the embodiment shown in FIG. 1.
Figure 3:
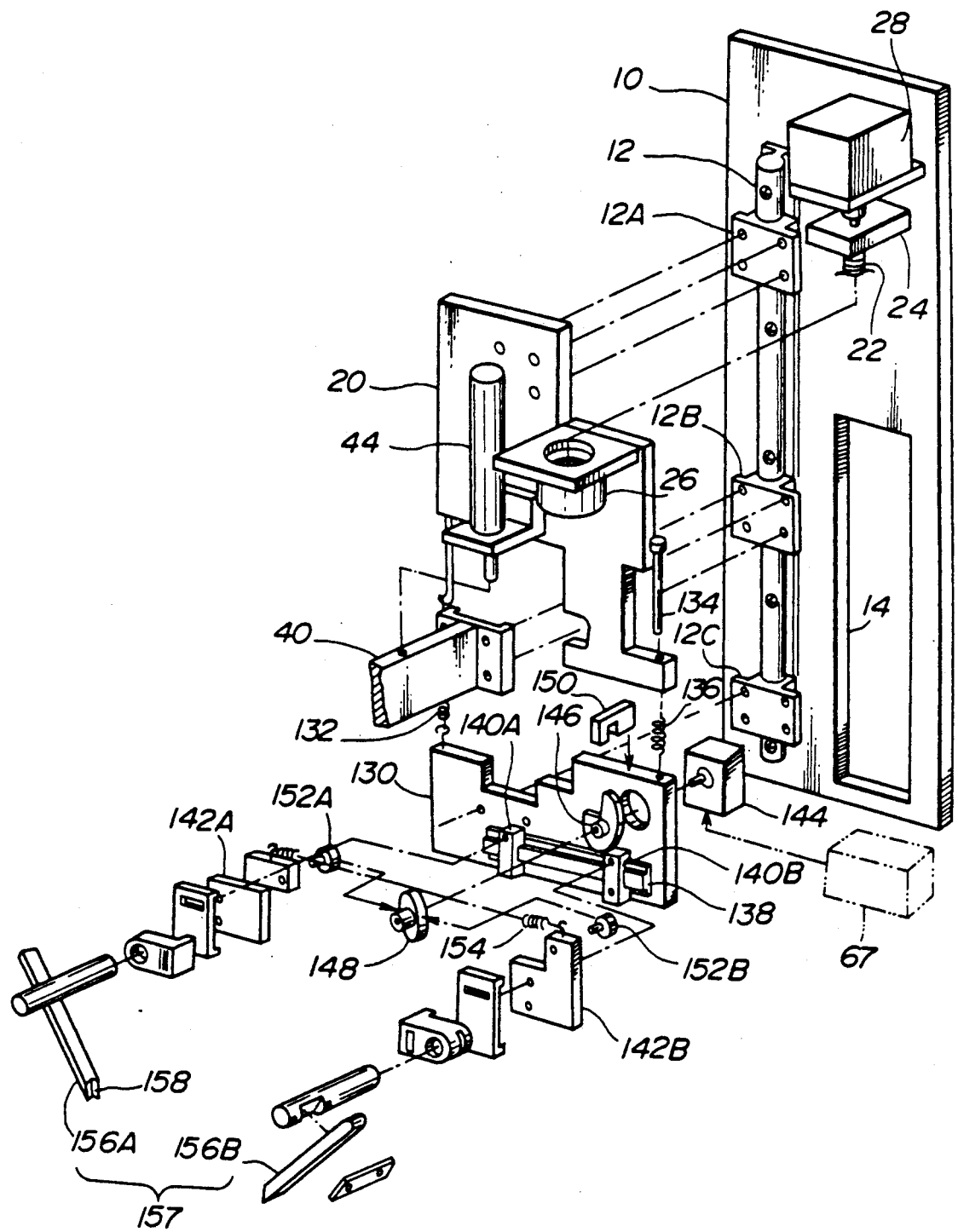
FIGS. 3 and 4 are exploded views showing parts of the embodiment shown in FIG. 1.
Figure 4:
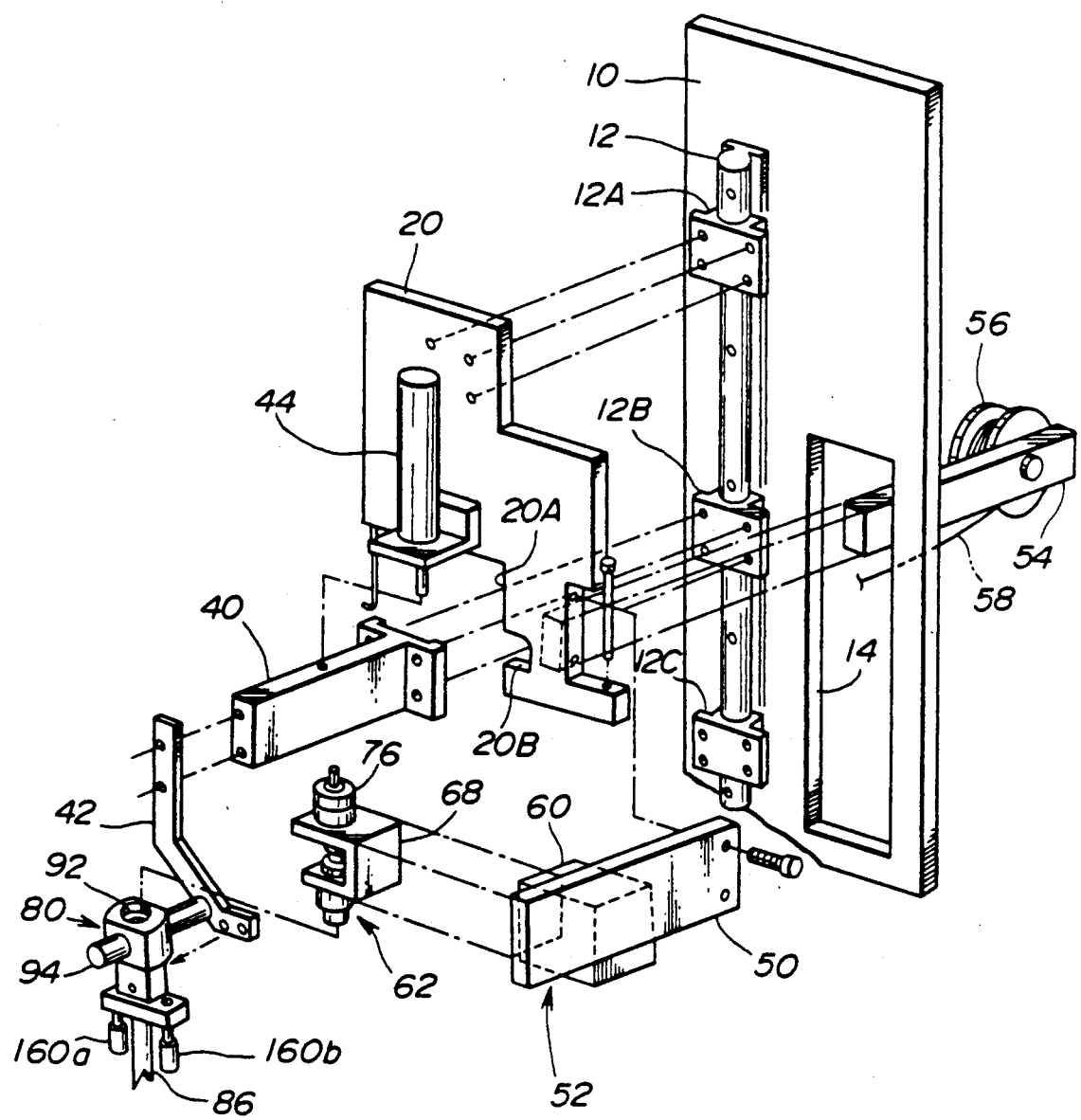

Initially referring to FIGS. 1 to 4, a carrier plate 10 is denoted by reference numeral 10 and fixed to a not-shown stand to extend in the vertical direction. As shown in FIGS. 3 and 4, a linear bearing track 12 is fixed on one side of the carrier plate 10 to extend vertically, and three movable blocks 12A, 12B and 12C are mobvably mounted on the track 12. Each of the movable blocks 12A to 12C contains a bearing and moved smoothly along the track 12 in the vertical direction without rotating around the track 12. An elongated window or opening 14 are formed through the carrier plate 10 at the right side as viewed in FIGS. 3 and 4.

A movable plate 20 is fixed to the uppermost movable block 12A to be moved in the vertical direction. A feed screw 22 extends in the vertical direction and has an upper end fixedly held by a bearing holder 24 which is fixed at an upper right portion of the carrier plate 10, the feed screw 22 being thrusted into a nut holder 26 fixed to the movable plate 20. The feed screw 22 is rotated by a stepping motor 28 secured to an upper portion of the carrier plate 10. As the feed screw 22 rotates, the movable plate 20 which is integrally fixed to the nut holder 26 is moved in the vertical direction. A fan motor 30 is provided at the left side (as viewed in FIGS. 1 and 2) of the motor 28. The top, front, left and right sides of the assembled soldering apparatus is covered by a cover plate (not shown), with the carrier plate 10 serving as a backing plate. Fresh air is introduced by the fan motor 30 into the space covered by the cover plate, and the thus introduced air is flown downwards to remove smokes generating from the solder as it is melted.

A solder guide bracket is denoted by reference numeral 40. The bracket 40 is fixed to the intermediate movable block 12B mounted on the linear bearing track 12 and extends forwardly through a cut-out 20A formed through the upper movable plate 20. An arm 42 is fixed to the fore end of the bracket 40 and has a lower end extending to a vicinity of the front center portion of the soldering apparatus. A solder guide assembly 80 serving as a solder tip guide means, which will be described in detail hereinafter, is fixed to the lower end of the arm 42. The bracket 40 is moved in the vertical direction by means of a pneumatic cylinder 44 which is fixed to the upper movable plate 20. In detail, the cylinder of the pneumatic cylinder 44 is fixed to the upper movable plate 20, and a piston rod operatively associated with the pneumatic cylinder 44 has an lower end secured to the top face of the bracket 40.

Reference numeral 50 designates a solder feeder plate fixed on the upper movable plate 20. As shown in FIG. 4, the plate 50 is fixedly secured on the right end face of the upper movable plate 20 to extend forwardly. A solder tip supply assembly 52 is mounted on the plate 50, and the solder tip supply assembly 52 supplies a solder tip 58A cut to have a constant length to the solder guide assembly 80 which will be described hereinafter. Referring to FIGS. 2 and 4, a reel holding arm is denoted by 54 and has one end fixed to the back side of the upper movable plate 20 and the other end extending rearwards through the window 14 of the carrier plate 10. A solder reel 56 is held by the reel holding arm 54, and a continuous rod-shaped solder 58 is fed from the reel 56 to pass through a window 20B (see FIG. 4) formed aside the cut-out 20A of the upper movable plate 20 into the solder tip supply assembly 52.

Figure 5:
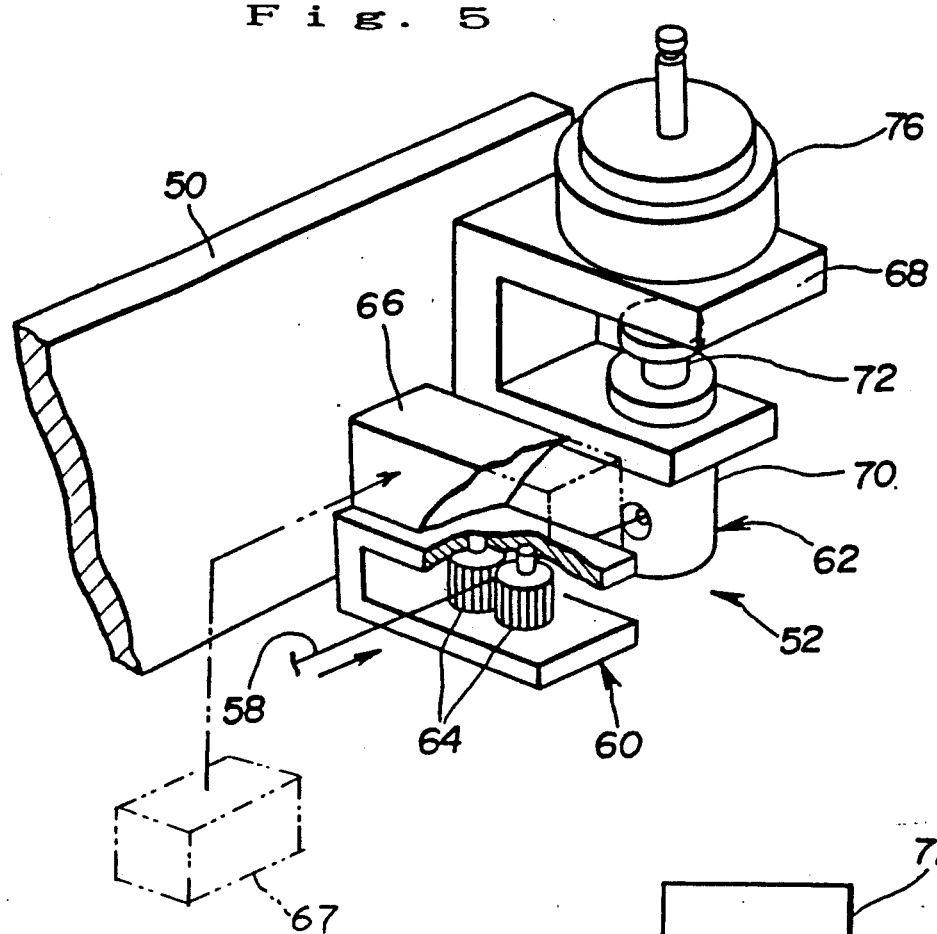
FIG. 5 is a perspective view showing the solder supply assembly of the embodiment shown in FIG. 1.
Figure 6:
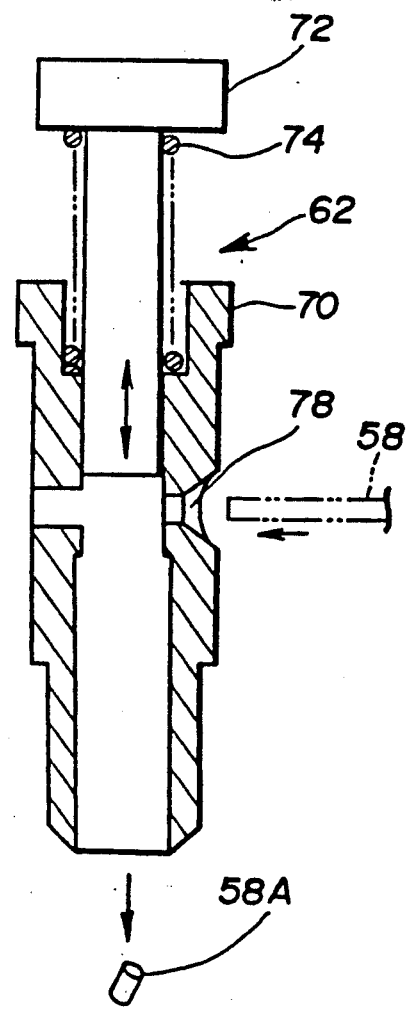
FIG. 6 is a sectional view showing the cutter for cutting a solder tip from a continuous rod-shaped solder.

The solder tip supply assembly 52 comprises a feed section 60 and a cutter section 62, as shown in FIG. 5. The feed section 60 includes paired rollers 64, 64 for grasping the solder 58, and a stepping motor 66 which drives one of the rollers 64. The motor 66 is controlled by a controller 67 to rotate the roller 64 at a pre-set timing to feed a predetermined length of the solder 58 to the cutter section 62. The cutter section 62 includes a holder 68 secured to the feeder plate 50 and having a shape of lying squalish letter U, a cylindrical body 70 secured to the bottom face of the lower leg of the holder 68, a cutter pin 72 movably inserted into the body 70, a restortion spring 74 (see FIG. 6) for restoring the cutter pin 72 to the upper position, and a pneumatic cylinder 76 mounted on the upper leg of the holder 68 to press the cutter pin 72 downwardly. A solder inlet port 78 is provided through the side wall of the body 70 and faces to the paired rollers 64, 64.

As a pre-set length of the rod-shaped solder 58 is fed by the feed section 60, the fore end of the solder 58 is moved through the solder inlet port 78 into the bore of the body 70, and then air is fed into the pneumatic cylinder 76 by changing over a change-over valve 120 in response to the instruction from the controller 67 so that the cutter pin 72 is pressed downwards. Whereupon, the fore end of the solder 58 is cut, and the cut solder tip 58A falls downwards in the bore of the body 70.

Figure 7:
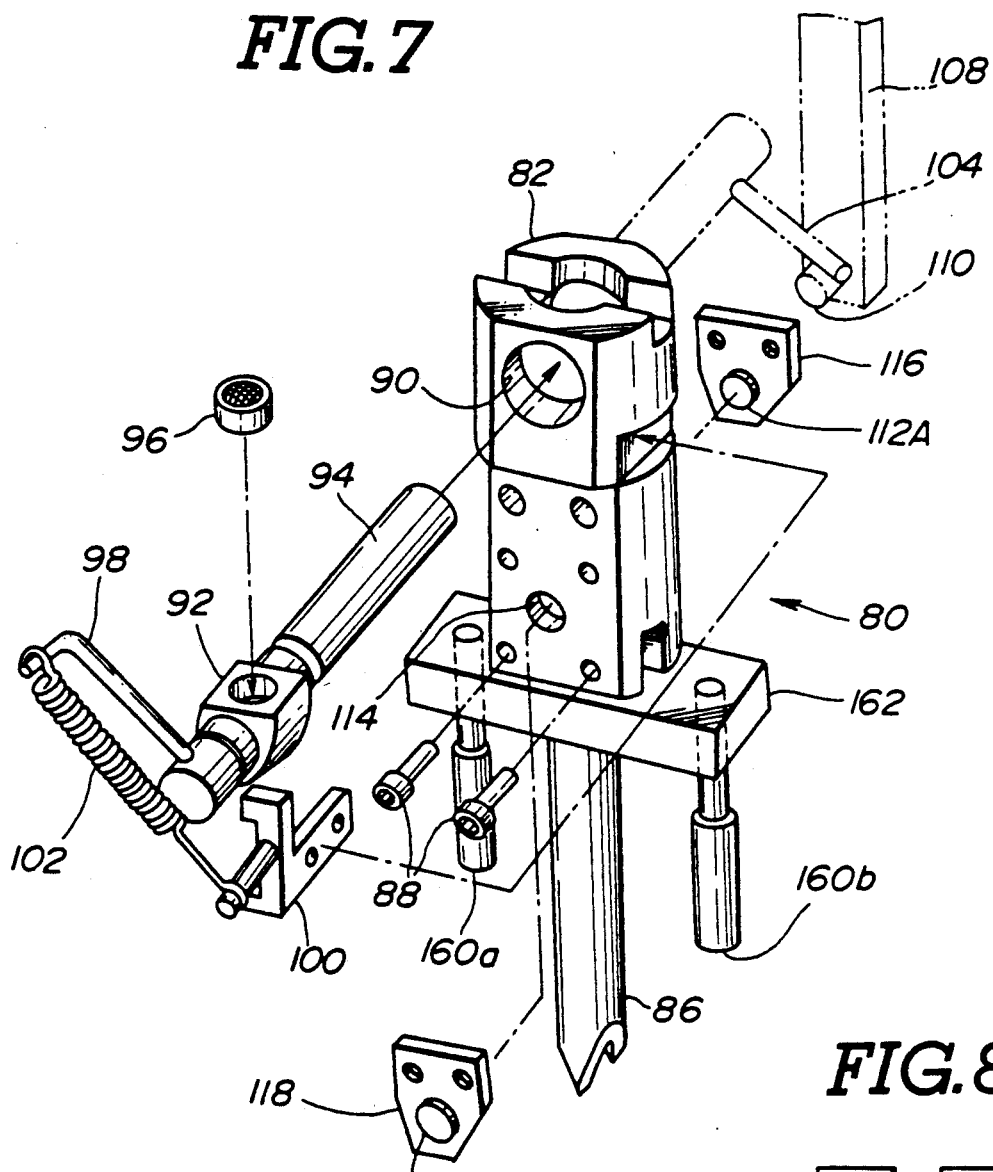
FIG. 7 is an exploded view showing the details of the solder guide means of the embodiment shown in FIG. 1.
Figure 8:
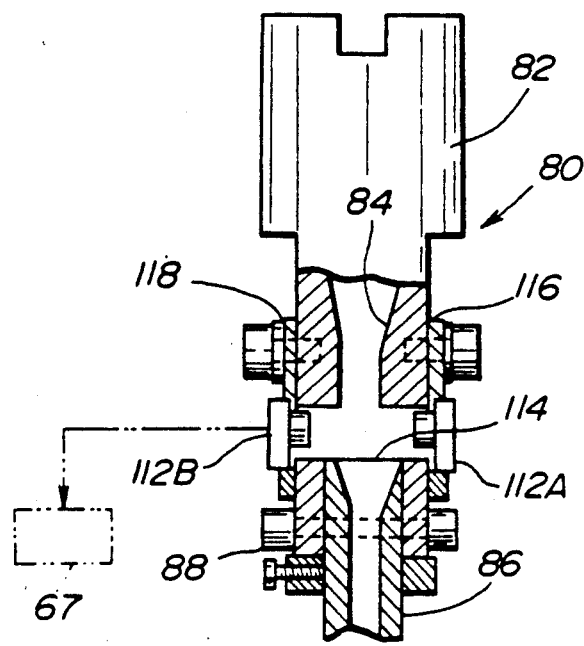
FIG. 8 is a sectional view of the assembled solder guide means taken along the center axis thereof.

As shown in FIGS. 7 to 9, the solder guide assembly 80 has a body 82 through which a guide bore 84 is formed. The guide bore 84 extends in the vertical direction and has a funnel-shaped upper portion and a lower portion connected to a sleeve 86. In detail, a slot is formed tranversely through the lower portion of the body 82, and the sleeve 86 inserted in the lower portion of the body 82 is fixed by fastening screws 88 (see FIGS. 7 and 8). A transverse through-hole 90 extends through the wall of the body 82 at the position where the upper enlarged portion (i.e. the funnel-shaped upper portion) of the guide bore 84 is formed. A cradle 92 is contained in the enlarged portion of the guide bore 84, and a shaft 94 integrally fixed to the cradle 92 extends through the transverse through-hole 90. The cradle 92 serves as a receiver for receiving the solder tip 58A falling from the cutter section 62 and has the inner surface fitted with a cup 96 made of a fluorocarbon resin such as Tefron (Trade Name) for preventing the solder tip 58 to stick onto the inner surface of the cradle 92. The inner surface of the cup 96 may be embossed or indented to facilitate smoother delivery of the solder tip 58A. Otherwise, the inner surface of the cradle 92 may be lined with a fluorocarbon resin.

Figure 9A:
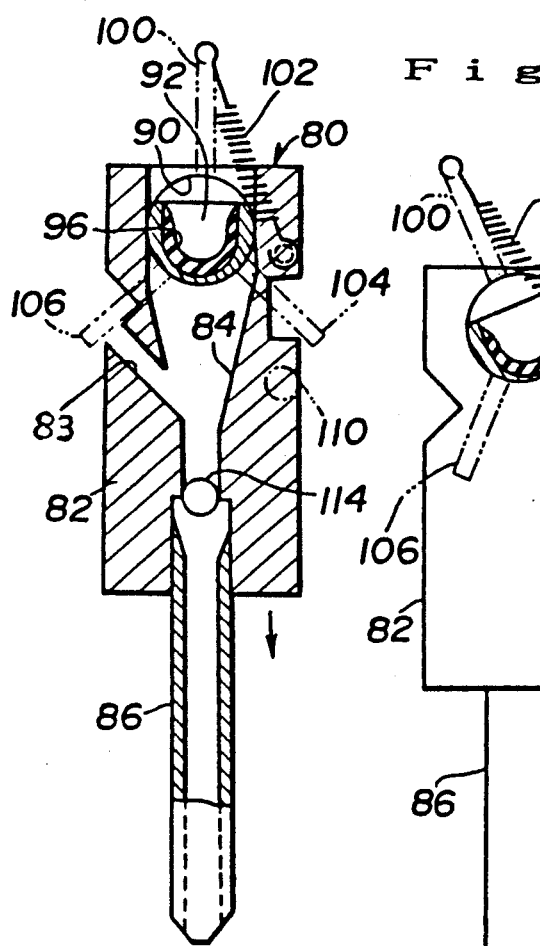
FIGS. 9A to 9C are views illustrating the operation of the cradle.
Figure 9B:
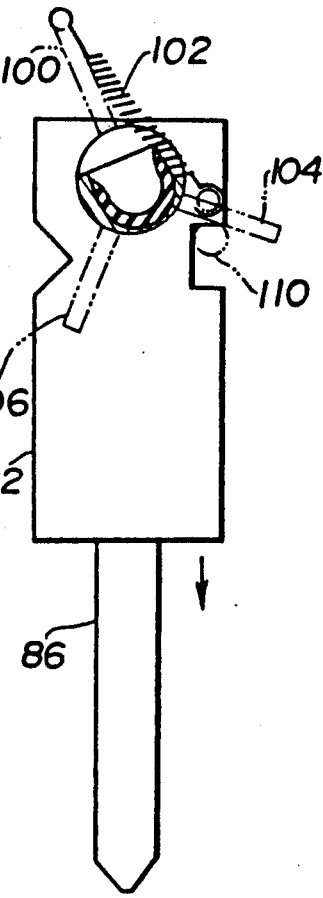
Figure 9C:
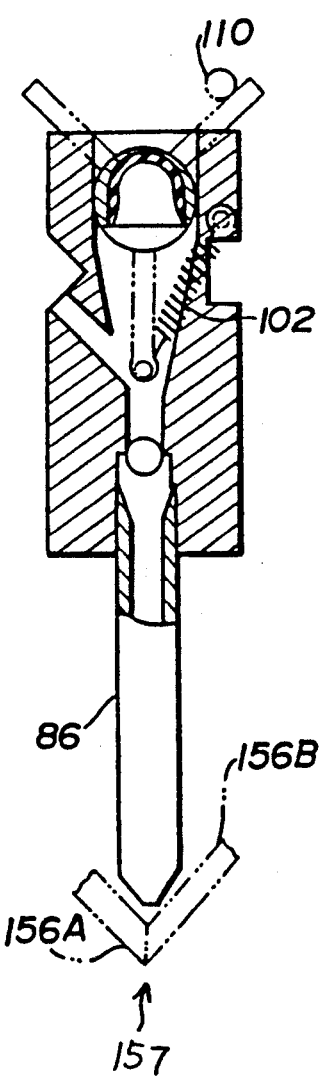

The shaft 94 has a fore end to which an arm 98 is connected. A stopper 100 is connected to the body 82 so that the arm 98 swings as the shaft 94 is rotated by about 180 degrees. When the swinging arm 98 abuts against the stopper 100, the rotational movement of the shaft 94 is stopped. When the arm 98 engages with the upper edge of the stopper 100, the cradle 92 is held at the upside position where the opening of the cradle 92 faces upwards as shown in FIG. 9A. When the arm 98 engages with the lower edge of the stopper 100, the cradle 92 is inverted to be held at the upside-down position where the opening of the cradle 92 faces downwards as shown in FIG. 9C. A coil spring 102 extends between the bent end of the arm 98 and the stopper 100 to retain the cradle 92 stably at the upside position shown in FIG. 9A and also at the upside-down position shown in FIG. 9C.

Two pins 104 and 106 are mounted to the rear end of the shaft 94 and extend radially from the shaft 94, the angle between the pin 104 and the pin 106 being about 90 degrees. These pins 104 and 106 extend obliquely as shown in FIG. 9A when the cradle 92 is retained in the upside position. On the other hand, an arm 108 is connected to the feeder plate 50 which is integrally mounted to the upper movable plate 20, and the arm 108 extends downwardly as shown in FIG. 7. A cam follower 110 protrudes from the lower end of the arm 108 to be engaged with these pins 104 and 106. With such a construction, as the solder guide assembly 80 is moved in the vertical direction by means of the pneumatic cylinder 44, these pins 104 and 106 engage with the cam follower 110 so that the cradle 92 is inverted between the upside position shown in FIG. 9A and the upside-down position shown in FIG. 9C. As the solder guide assembly 80 is lowered, the cradle 92 is inverted to be retained in the upside-down position.

A sensor 112 for sensing the falling solder tip 58A is disposed in the body 82 of the solder guide assembly 80 (see FIGS. 7 and 8). In detail, a transverse hole 114 is formed through the body 82 and crosses the solder guide bore 84 at right angle, and a light emitting element 112A is disposed at one end of the hole 114 and fixedly retained by a sensor carrying plate 116 while a light receiving element 112B is disposed at the other end of the hole 114 and fixedly retained by another sensor carrying plate 118. As the light-receiving element 112B senses passage of the solder tip 58A, the controller 67 actuates clock means contained therein which counts the time from the timing at which the solder tip 58A is sensed. The time for retaining and melting the solder in a melting pot 157 formed by plural trowel members 156, which will be described in detail hereinafter, is controlled by the controller 67 with reference to the lapse of time counted by the clock means.

The body 82 of the solder guide assembly 80 is also provided with an air inlet port 83 through which air is blown into the guide bore 84. The air blown through the inlet port 83 prevents the smoke generated from the molten solder in the trowel members 156 from sticking to the inner surface of the guide bore 84 to ensure smooth fall-down of the solder tip 58A (see FIG. 9A).

Air fed to the body 82 and the pneumatic cylinders 44 and 76 is supplied from an external source, as shown in FIG. 2, and intermittently supplied by means of a change-over valve 120 (see FIG. 2). Reference numeral 121 designates an air pump serving as blower means for supplying air to the pneumatic cylinders 44 and 46 through the change-over valve 120.

The trowel members 156 which come together to form the solder melting pot 157 will now be described. In FIG. 3, reference numeral 130 designates a lower movable plate. The lower movable plate 130 is secured to the movable block 12C to be moved in the vertical direction. The left side of the lower or first movable plate 130 is suspended from the upper or second movable plate 20 through a coil spring 132, and the right side thereof is suspended from the upper movable plate 20 through a bolt 134. As a result, the lower movable plate 130 is moved in the vertical direction together with the upper movable plate 20. The bolt 134 is slidingly inserted through a bore formed in the upper movable plate 20 so that the lower movable plate 130 is moved upwards together with the trowel members 156 when the trowel members 156 impinge on the surface of the workpiece to prevent damage of the workpiece upon such impingement by the trowel members. A compression spring 136 is disposed around the bolt 134 to apply a proper compression force on the trowel members 156 when it is desired to press the trowel members 156 onto the surface of the workpiece.

A slide rail 138 is secured to the lower movable plate 130 and extends horizontally. Movable blocks 140A and 140B are slidingly mounted to the rail 138, and paired trowel member carrier plates 142 (142A, 142B) are fixed to the movable blocks 140A and 140B. A stepping motor 144 is mounted on the back side of the lower moveble plate 130 and has a shaft extending forwards through the lower movable plate 130. An encoder cam 146 and a cam 148 are fixedly mounted on the fore end of the shaft of the motor 144. The encorder cam detects the rotation angle of the motor 144 by a photo-sensor 150. The cam 148 has a generally elliptical contour and symmetrically mounted on the shaft of the motor 144. Cam followers 152 (152A, 152B) mounted to the aforementioned trowel member carrier plates 142 rotatably engage with the cam 148 from the right and left sides. The trowel member carrier plates 142 are biased by a spring 154 to be applied with a force which acts to get the carrier plates 142 to come close with each other (see FIG. 3).

In the illustrated embodiment, paired trowel members 156 (156A, 156B) are secured to the trowel member carrier plates 142, the angle and position of each trowel member 156 being adjustable. These trowel members 156 extend obliquely from the carrier plates 142 to have their lower ends separably engaged with each other just beneath the sleeve 86 connected to the aforementioned solder tip guide assembly 80. They form the V-shaped pot 157, as viewed from the front side, when engaged with each other. Each trowel member 156 contains a nichrom wire heater and has a surface made of a material which repels molten solder, such as ceramics, fluorocarbon resin or stainless steel. A silicon nitride ceramic material is particularly preferred, since it has a high resistance to permeation of solder and to chemicals, such as hydrochloric acid, contained in the flux of the solder and also has improved durability.

A groove 158 (see FIG. 3) is formed on the end surface of each trowel member 156 so that a cavity defining the solder melting pot 157 is formed when the end surfaces of both trowel members 156 are joined with each other with their grooves 158 facing to one another.

The end surfaces of the trowel members 156 are filed by a bar-shaped files 160 (160a, 160b). In detail, a carrier plate 162 is connected to the sleeve 86 of the solder tip guide assembly 80, and a pair of files 160 are secured to the carrier plate 162 to extend therefrom in the vertical direction. Accordingly, by lowering the files 160, the files 160 engages with the grooves 158 of the trowel members 156 while pushing the trowel members outwardly see FIGS. 10A and 10B).

The operation of the illustrated embodiment will now be described. Initially, a desired portion of a workpiece, on which molten solder is applied, is placed beneath the assembled trowel members 156. The solder tip guide assembly 80 is positioned at the upper position as shown in FIGS. 1 and 2 at this time, and the trowel members 156 are closely retained with their end faces engaging with each other. A pre-sent length of the rod-shaped solder 58 is supplied by the solder tip supply assembly 52, and then the cutter pin 72 is lowered by the pneumatic cylinder 76 to cut a solder tip having a predetermined length, the thus cut solder tip 58A falling downwards. The solder tip 58A is received by the cradle 92 of the solder tip guide assembly 80 and temporarily held thereby in the stationary condition. Then, air is supplied into the pneumatic cylinder 44 to lower the bracket 40 together with the solder tip guide assembly 80. As the solder tip guide assembly 80 is lowered, the pin 104 of the shaft 94 engages with the cam follower 110 so that the shaft 94 is rotated as shown in FIG. 9B. When the spring 102 connected to the fore end of the stopper 100 moves beyond the unstable point at which the spring 102 passes the center axis of the shaft 94, the shaft 94 is rotated promptly to the position shown in FIG. 9C by the action of the spring 102. The cradle 92 is thus inverted, and the solder tip 58A leaves from the cradle 92 while being applied with a shock of prompt inversion of the cradle 92 to fall through the guide bore 84 in the solder tip guide assembly 80 and then through the sleeve 86. As the solder tip guide assembly 80 is moved to the lower position, the lower end of the sleeve 86 comes close to the solder melting pot 157 formed by the assembled trowel members 156 (as best seen in FIG. 9C). The solder tip 58A falls from the sleeve 86 to be received in the solder melting pot 157 formed by the assembled trowel members 156, where it is heated and melted. The solder tip guide assembly 80 is rapidly raised to the stand-by position as shown in FIG. 9A after the solder tip 58A leaves therefrom.

The solder tip 58A falling through the guide bore 84 is sensed by the light receiving element 112B which generates a signal. The signal generated from the light receiving element 112B is fed to the controller 67 which instructs the timer to begin counting the lapse of time. After the lapse of the pre-set time duration, the motor 144 is actuated to rotate the cam 148 so that the trowel members 156 are separated. As a result, the molted solder contained in the solder melting pot 157 defined by the grooves 158 of the engaged end surfaces of the trowel members 156 is allowed to drop onto the workpiece to effect soldering.

After the repeated soldering operations, components of the flux contained in the solder or other impurities generated during the melting operation left on the surfaces of the grooves 158 of the trowel members 156 have sticked on the surfaces and cured. When it is desired to remove such stains on the surfaces of the trowel members 156, the trowel members 156 are separated from one another and the solder tip guide assembly 80 is lowered, whereby the bar-shaped files 160a, 160b engage with the grooves 158 while pushing the trowel members 156A, 156B outwardly. By lowering and raising the solder tip guide assembly 80 for some times, the sticking stains can be removed by the files 160.

Some operation modes of the illustrated embodiment will now be described with reference to FIGS. 11 to 16.

Figure 11:
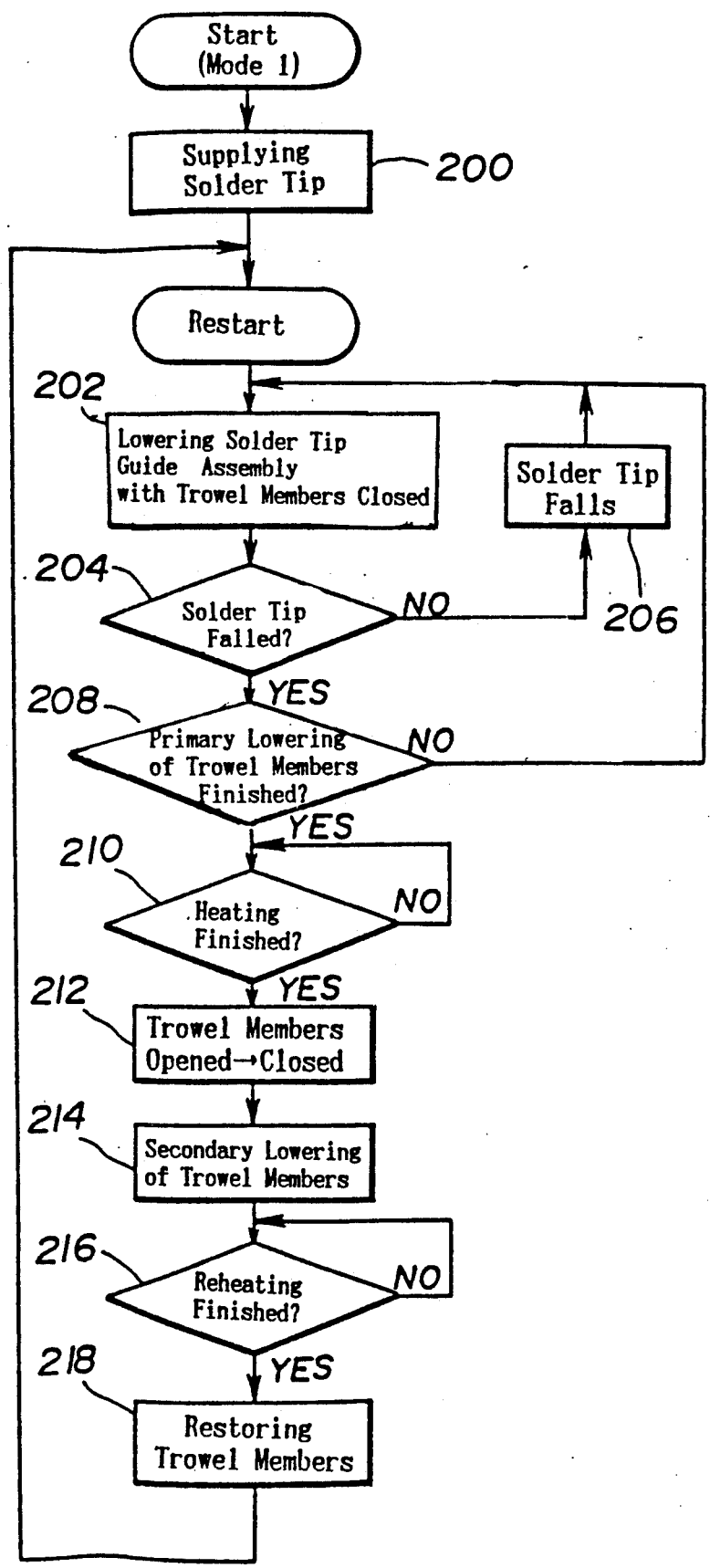
FIGS. 11 to 16 are flow charts showing the operation sequences of the embodiment of FIG. 1 used in different operation modes.

In the operation mode 1 shown in FIG. 11, the solder tip 58A is supplied from the solder tip supply assembly 52 to the cradle 92, and the system is held at this stand-by condition (Step 200). In response to a signal for restarting the soldering operation (Restart), the trowel members 156 are lowered in the assembled condition and the solder tip guide assembly 80 is lowered simultaneously (Step 202). During this lowering operation, the cradle 92 is inverted to allow the solder tip 58A to fall through the solder tip guide assembly 80 (Steps 204 and 206). The trowel members 156 are lowered to the primary lowered position and the system is held at this stand-by condition (Step 208). As the solder tip 58A falls at the Step 206, the sensor 112 senses the falling solder tip 58A to initiate counting of the heating time duration by the clock means provided in the controller 67. When the counted time reaches the pre-set time programmed for melting the solder tip 58A in the assembled trowel members 156 (Step 210), the trowel members 156 are once opened to allow the molten solder to drop and then closed again (Step 212). Then, the trowel members 156 are further lowered (secondary lowering) in the closed condition to move close to the solder dropped onto the workpiece (Step 214) to reheat the solder for a pre-set time duration (Step 216). Thereafter, the trowel members 156 are raised to the restored position (Step 218).

Figure 12:
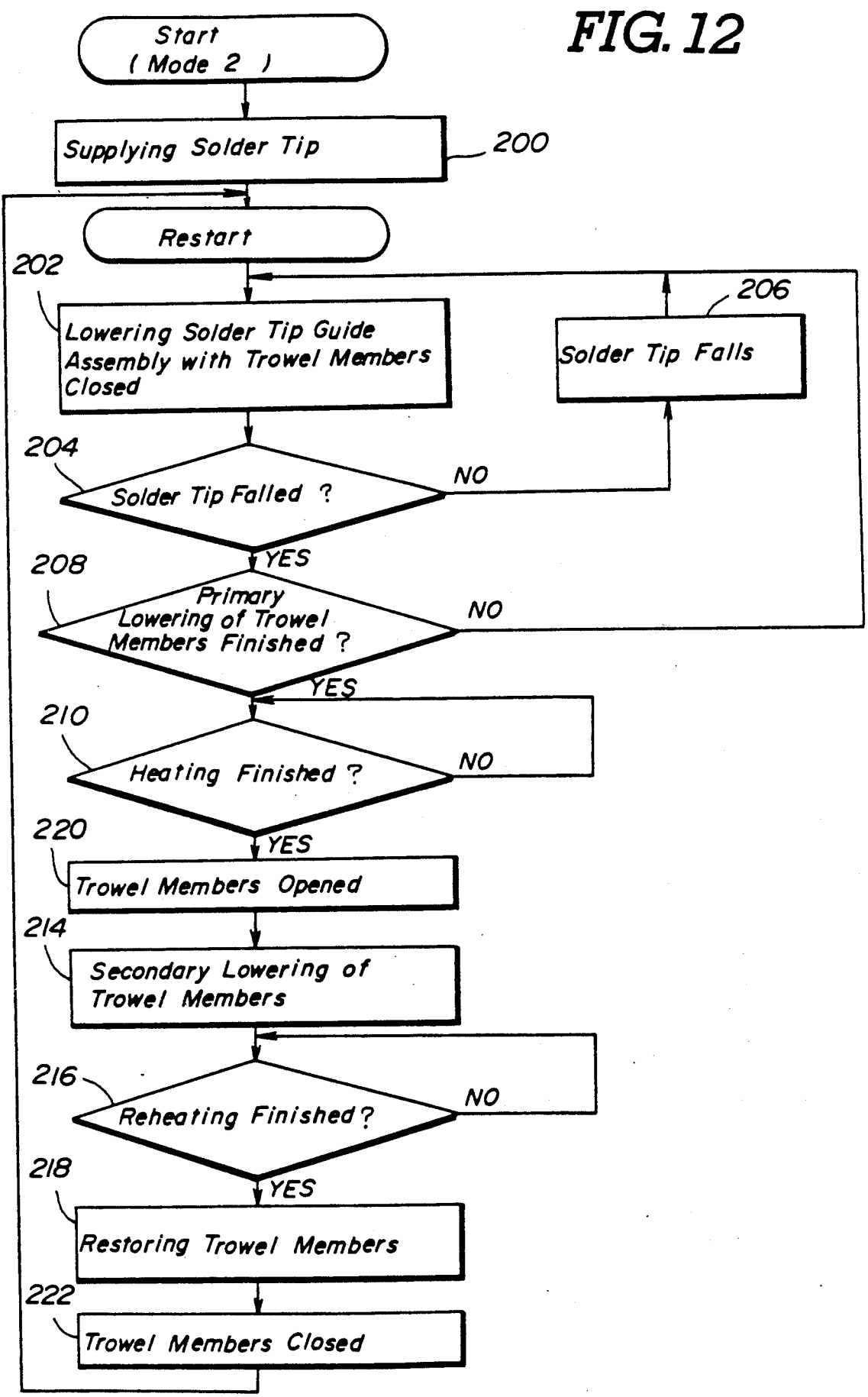

The operation mode 2 shown in FIG. 12 is similar to the mode 1 shown in FIG. 11, except the Steps 220 and 222. More particularly, the trowel members 156 are lowered (secondary lowering) while they are separated from one another to reheat the molten solder dropped onto the workpiece. According to this operation mode 2, the trowel members 156 are prevented from contacting with the heap of the molten solder on the workpiece to eliminate collapsing of the solder mass at the reheating step.

Figure 13:
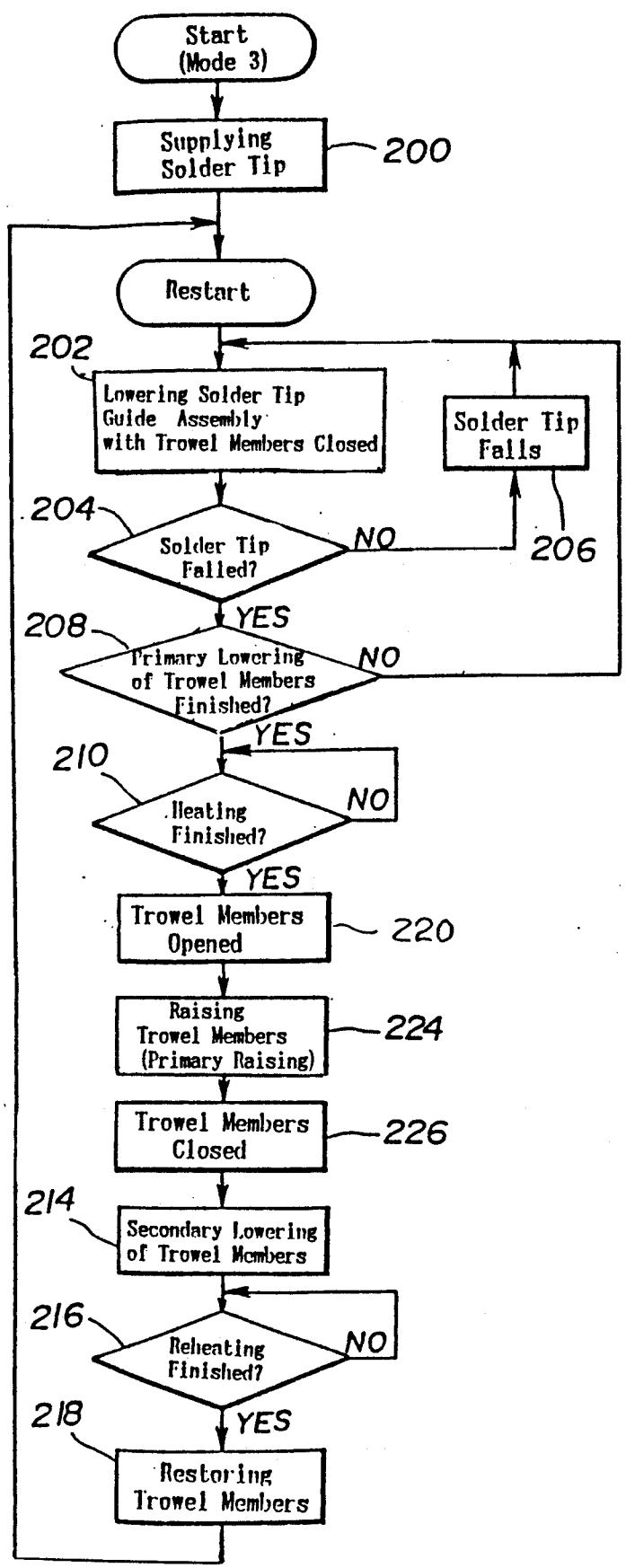

In the operation mode 3 shown in FIG. 13, the trowel members 156 are raised and then closed (Steps 224 and 226) after the molten solder is allowed to drop onto the workpiece, and then lowered again to reheat the workpiece and the solder dropped onto the workpiece (Step 216) followed by restortion of the trowel members 156 (Step 218). According to this operation mode 3, the molten solder is allowed to drop from a position close to the workpiece so that the solder is applied on the precisely controlled area on the workpiece.

Figure 14:
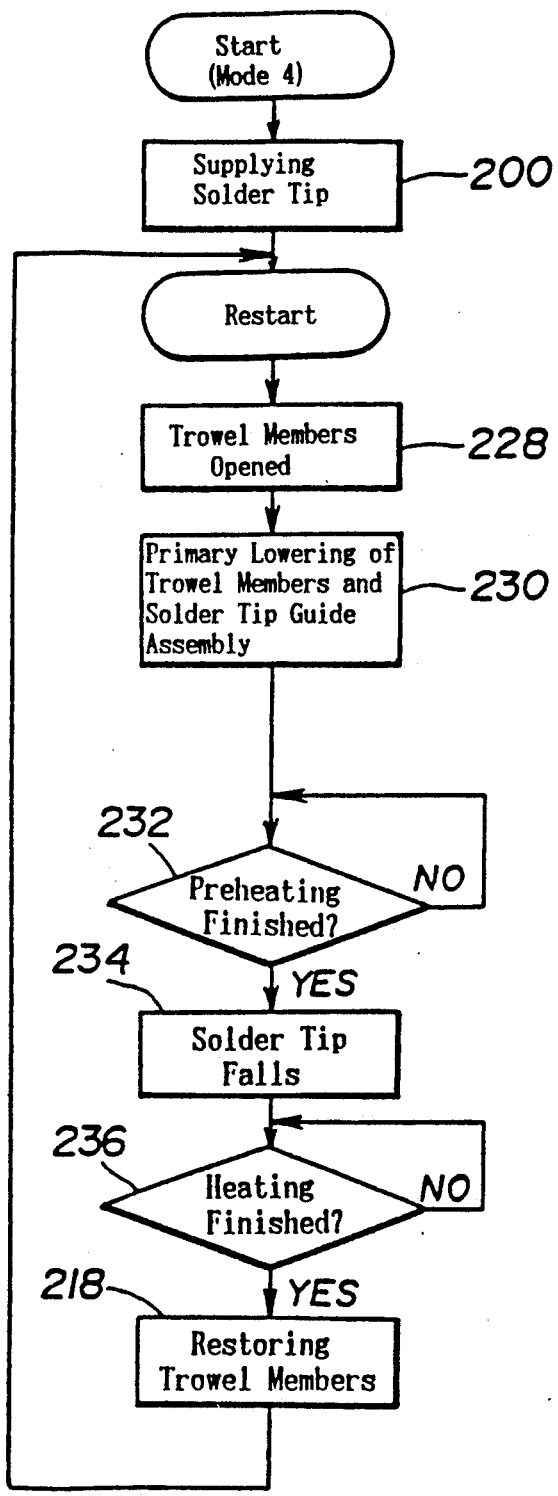

In the operation mode 4 shown in FIG. 14, the trowel members 156 are separated (Step 228) and then lowered in this separated or open condition to come close to or to contact with the workpiece to preheat the workpiece (Steps 230 and 232). After allowing to drop the solder tip onto the preheated workpiece to allow the same to adhere to the surface (Step 234), the solder tip 58A is heated for a predetermined time to melt the same (Step 236). According to this operation mode 4, satisfactory soldering can be effected even if the workpiece has an extremely high thermal conductivity.

Figure 15:
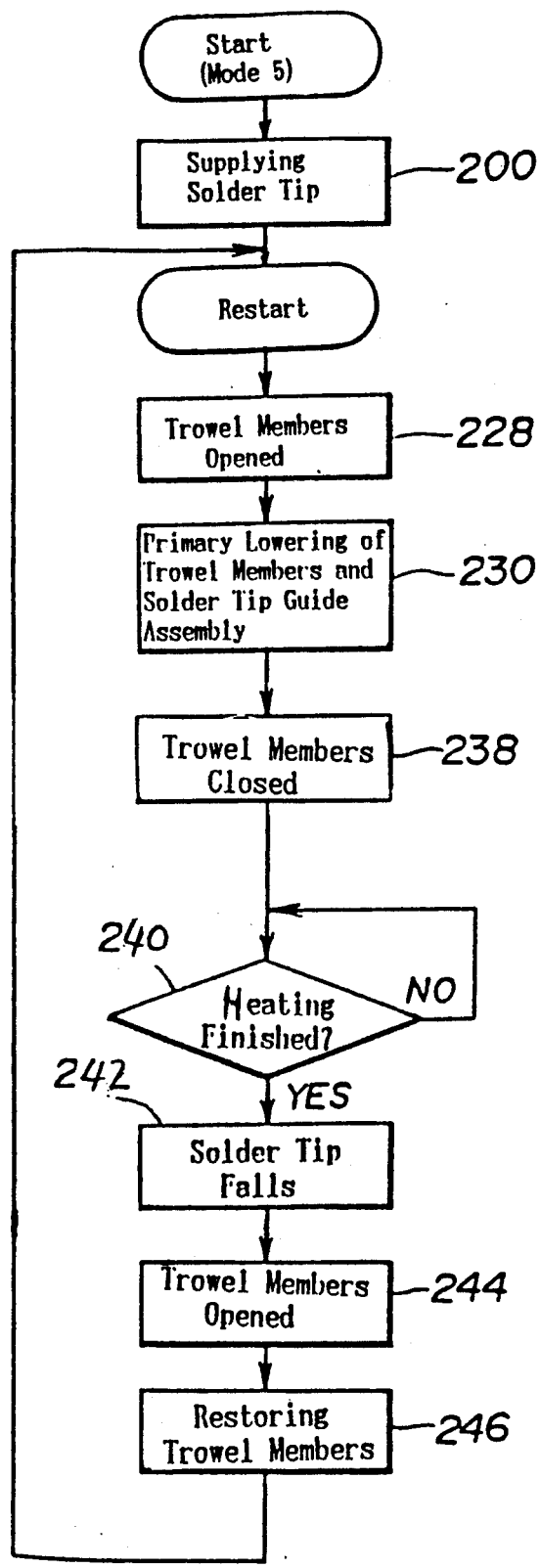

The operation mode 5 shown in FIG. 15 is conceived to apply solder around a standing pin on which a wire is wound. In detail, the trowel members 156 are lowered in the open condition (Steps 228 and 230) to cramp the pin (Step 238), and then the pin is heated by the trowel members 156 for a pre-set time duration (Step 240). The solder tip 58A is dropped between the end surfaces of the trowel members 156 cramping the pin to melt the solder tip 58A and the molten solder is applied over the wire turns wound around the standing pin (Step 242). Then, the trowel members 156 are opened (Step 244) and raised to the restored position (Step 246).

Figure 16:
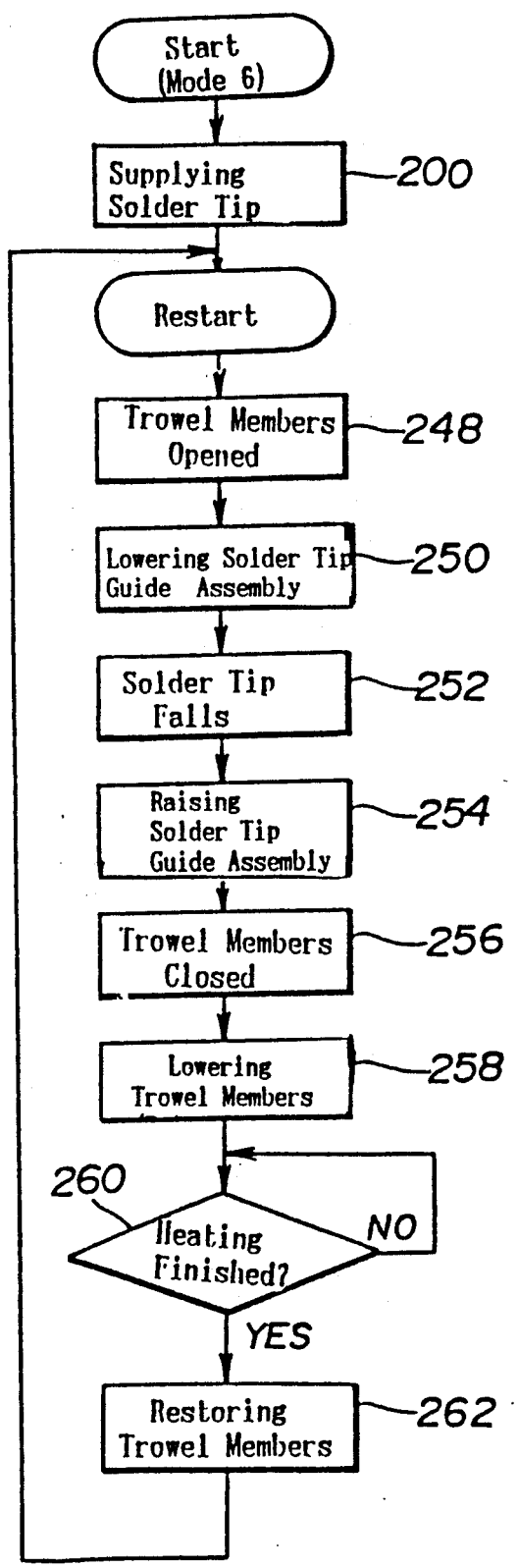

In the operation mode 6 shown in FIG. 16, the solder tip guide assembly 80 is lowered through the gap between the open trowel members 156 to come close to the workpiece (Steps 248 and 250), and then the solder tip 58A is placed on the workpiece (Step 252). After retracting the guide assembly 80 upwards (Step 254), the trowel members 156 are closed and then lowered to heat the workpiece and the solder tip 58A placed thereon to melt the solder tip 58A (Steps 256, 258 and 260). Thereafter, the trowel members 156 are restored to the upper position (Step 262). According to this operation mode 6, since the solder tip is dropped onto the workpiece in the condition that the solder tip guide assembly 80 is positioned close to the workpiece, even a very small solder tip can be securely placed on the desired point on the workpiece without the fear that the solder tip sticks to either of the trowel members 156.

According to the first aspect of this invention, a solder tip having a constant length and supplied from the solder tip supply assembly is temporarily held into the stationary condition by a cradle and then allowed to fall in the solder melting pot formed by plural trowel members having their end surfaces engaged with each other to melt the solder tip to form a molten solder mass which is dropped onto the workpiece to effect soldering by separating the trowel members from each other. The scattering in falling velocity or timing for falling the solder tip is minimized to result in minimization of scattering in temperature of the molten solder. As a result, uniform soldering can be expected to improve the reliability of the soldering operation. In addition, the quantity of the applied solder can be controlled precisely even when a very small volume of solder is to be applied on the workpiece.

An apparatus used for realizing the method of this invention is also provided. When the falling solder tip which has been once stationarily retained by the cradle is sensed by a photo-sensor or like means to initiate counting of the time by clock means to control the time used for melting the solder tip and to determine the timing at which the trowel members are separated, the time for melting the solder tip and for heating the molten solder is controlled more precisely to enhance the advantageous effect of the present invention.

In a preferred embodiment, files are secured to the solder tip guide assembly which is movable in the vertical direction so that the files are slidingly engaged with the end surfaces of the trowel members by moving the solder tip guide assembly in the vertical direction to remove the flux or other debris sticking to the facing end surfaces of the trowel members by simple operations. As a result, the solder tip is heated always in the stable condition to effect satisfactory soldering.

Although the present invention has been described with reference to a presently preferred embodiment, many modifications and alternations may be conceived by a person having ordinary skill in the art in the light of the teachings herein. For example, the pneumatic system incorporated in the apparatus of this invention may be replaced by a hydraulic system. It should be appreciated that all such modifications and alternations are embraced within the scope of the invention as defined in the appended claims.

What is claimed is:

1. In the soldering method for soldering a workpiece, which comprises forming a solder melting pot by engaging plural trowel members, each of said trowel members having a surface made of a solder repellent material at least the portion contacting with the solder, supplying a solder tip having a constant volume to said solder melting pot, melting said solder tip and holding the molten solder temporarily in said solder melting pot, and then separating said plural trowel members to allow the molten solder to drop onto said workpiece, an improved method wherein said solder tip is once held stationarily above said solder melting pot and then allowed to fall into said solder melting pot.

2. A soldering apparatus for soldering a workpiece, comprising:
    plural trowel members each having a surface made of a solder repellent material at least the portion contacting with the solder, said plural trowel members being engaged together to form a solder melting pot and separated to allow the molten solder to drop onto said workpiece;
    a solder tip supply assembly for supplying a solder tip having a constant volume to said solder melting pot;
    a cradle disposed above said solder melting pot for receiving said solder tip supplied from said solder tip supply assembly to hold said solder tip temporarily in the stationary condition; and
    inversion means for inverting said cradle to allow said solder tip to fall into said solder melting pot.

3. The soldering apparatus according to claim 2, wherein said cradle is movable between an upper position at which said solder tip is received from said solder tip supply assembly and a lower position at which said solder tip is passed to said solder melting pot.

4. The soldering apparatus according to claim 3, wherein said inversion means comprises a pin projecting radially from the bearing shaft of said cradle, and cam follower means engaging with said pin to rotate said cradle as said cradle moves in the vertical direction.

5. The soldering apparatus according to claim 4, further comprising a restortion coil spring operatively associated with said bearing shaft of said cradle for stably retaining said cradle at the upside position and at the upside-down position.

6. The soldering apparatus according to claim 2, wherein the inner wall of said cradle is lined with fluorocarbon resin coating.

7. The soldering apparatus according to claim 2, wherein a cup made of fluorocarbon resin is received in said cradle.

8. The soldering apparatus according to claim 2, further comprising solder tip guide means for guiding said solder tip from said cradle to said solder melting pot, sensor means for sensing said solder tip falling through said solder tip guide means, and clock means for counting the time from the timing when said solder tip is sensed by said sensor means and for separating said trowel members after the lapse of a pre-set time duration.

9. The soldering apparatus according to claim 2, further comprising solder tip guide means for guiding said solder tip from said cradle to said solder melting pot, and blower means for blowing air into said solder tip guide means.

10. The soldering apparatus according to claim 2, wherein said solder tip supply assembly and said trowel members are movable along the vertical direction independently from each other.

11. The soldering apparatus according to claim 10, wherein said cradle is movable along the vertical direction together with said solder tip supply assembly.

12. The soldering apparatus according to claim 11, wherein said solder melting assembly is mounted to a first movable plate which is moved along the vertical direction, and wherein said first movable plate is suspended from a second movable plate through spring means, said second movable plate being movably carried by a carrier plate.

13. The soldering apparatus according to claim 2, further comprising solder tip guide means for guiding said solder tip from said cradle to said solder melting pot, and filing means mounted to said solder tip guide means at a position above said solder melting pot to be slidingly engaged with the joining end face of each trowel member as said solder tip guide means moves in the vertical direction to clean said joining end face of each trowel member.

* * * * *